United States Patent [19]

Krill et al.

[11] Patent Number: 5,148,134

[45] Date of Patent: Sep. 15, 1992

[54] OPTIMIZED DESIGN FOR $TE_{01}$ MODE CIRCULAR WAVEGUIDE CONNECTED TO A BEND SECTION

[75] Inventors: Jerry A. Krill, Ellicott City; Melrose M. Jesurun, Silver Spring; William H. Zinger, Columbia, all of Md.

[73] Assignee: The Johns Hopkins University, Baltimore, Md.

[21] Appl. No.: 677,033

[22] Filed: Mar. 29, 1991

Related U.S. Application Data

[62] Division of Ser. No. 310,193, Feb. 13, 1989, Pat. No. 5,046,016.

[51] Int. Cl.$^5$ .......................... H01P 3/127; H01P 1/02
[52] U.S. Cl. ..................................... 333/242; 333/249
[58] Field of Search ................ 333/239, 241, 242, 249

[56] References Cited

U.S. PATENT DOCUMENTS

| | | | |
|---|---|---|---|
| 2,762,981 | 9/1956 | Morgan, Jr. | 333/21 R |
| 2,950,454 | 8/1960 | Unger | 333/242 |
| 3,016,502 | 1/1962 | Unger | 333/239 X |
| 3,016,503 | 1/1962 | Pierce | 333/239 X |
| 3,066,268 | 11/1962 | Karbowiak | 333/241 |
| 3,289,121 | 11/1966 | Comte | 333/242 |
| 4,225,833 | 9/1980 | Comte | 333/242 |
| 5,046,016 | 9/1991 | Krill et al. | 333/242 X |

FOREIGN PATENT DOCUMENTS

| | | | |
|---|---|---|---|
| 1036341 | 8/1958 | Fed. Rep. of Germany | 333/242 |
| 35986 | 4/1978 | Japan | 333/242 |

OTHER PUBLICATIONS

Nouri, M., et al; "Laboratory Testing of dielectric lined circular waveguide sections"; *Trans Conf on Telecommunications by Guided Waves*; London, Eng.; 29 Sect.–Oct. 20, 1970; pp. 337–345.

Oliver, A. D.; "Waveguides"; *Engineering*; Jun. 1975; pp. 504–507.

Primary Examiner—Eugene R. LaRoche
Assistant Examiner—Benny Lee
Attorney, Agent, or Firm—Robert E. Archibald

[57] ABSTRACT

An optimized design for circular overmoded waveguide, of both the dielectric lined or sheathed helix types, operating in the microwave and lower millimeter wave bands.

8 Claims, 3 Drawing Sheets

DIELECTRIC LINED
WAVEGUIDE

SHEATHED HELIX
WAVEGUIDE b) Bend with no length of uniform curvature.

OPTIMIZED DESIGN FOR TE$_{01}$ MODE CIRCULAR WAVEGUIDE CONNECTED TO A BEND SECTION

STATEMENT OF GOVERNMENTAL INTEREST

This invention was made with Government support under Contract No. NOOO39-87-C-5301 awarded by the U.S. Navy Department. The Government has certain rights in this invention.

REFERENCE TO RELATED APPLICATION

This application is a division of co-pending and commonly assigned application Ser. No. 07/310,193, filed Feb. 13, 1989 by the present applicants which was issued as U.S. Pat. No. 5,046,016, Sep. 3, 1991.

BACKGROUND OF THE INVENTION

The most common type of waveguide propagates signals in only one specific electromagnetic field pattern or mode, out of an infinite number of possible modes. Single-mode operation occurs because the waveguide is designed so that signals are in a frequency band which is sufficiently low that only the mode with the lowest "cutoff frequency" can exist and no other mode can propagate. If other modes were allowed to propagate, signal energy could couple into and out of various modes substantially distorting the signal. Such a "conventional waveguide" is compact and easy to design, model and use. Unfortunately, maintaining only the lowest-cutoff mode in a given frequency band requires restriction of the waveguide cross section dimensions, and this, in turn, restricts power carrying capacity and limits the lowest achievable signal attenuation. As a result, design of some systems requiring microwave or millimeter wave signal transmission with high power or very low loss may be difficult or impractical.

An alternative type of waveguide is generally called "overmoded" in which a higher order mode is used, i.e. a mode which does not have the lowest cutoff frequency. Because other (unwanted) modes are also capable of existing as well as the desired transmission mode, this type of waveguide must feature internal structures which suppress the unwanted modes. Because internal structure, rather than restriction of cross section dimensions, is the basis for suppressing all but the desired mode, overmoded waveguide cross section can, in principle, be made arbitrarily large for a corresponding increase in power capacity and decrease in signal attenuation. Unfortunately, this type of waveguide, with unwanted mode suppression, is difficult to model and design, and its cross-sectional dimensions may not be amenable to compactness without significant design optimization.

Historically, the more successful type of overmoded waveguide supports the circular TE$_{01}$ mode and uses either a dielectric lining or dielectric sheathed helix of insulated wire inside the circular cross section waveguide for suppression and decoupling of unwanted modes, e.g. see A. E. Karbowiak "Trunk Waveguide Communication", Chapmen and Hall Ltd. 1965. Both versions of overmoded TE$_{01}$ waveguide were originally developed and tested for millimeter band (60–100 GHz) trunk line tele- communications between cities. Application of overmoded waveguide technology for high power and/or low loss transmission in microwave or millimeter wave radio communications and radar has also been suggested and developed to a limited degree, e.g. see R. M. Collins "Practical Aspects of High Power Circular Waveguide Systems" NEREM Record, Session 24, pp 182–183, (1962). However, more extensive use has been limited apparently due to limitations in optimization design modeling within the limits of available materials and manufacturing methods.

The difficulty in modeling overmoded waveguide is primarily related to the effects of design characteristics on mode coupling phenomena. Such modeling is necessarily numerical. Further, trends towards design optimization are difficult to affix and can be substantially different for different design situations. For example, changing a design parameter value, e.g. dielectric constant, can suppress one mode while causing significant coupling of another mode or even render the waveguide inoperable. A significant amount of effort has been expended in developing the theory and in performing computations to develop a practical design for an overmoded waveguide, as revealed in the following references:

"Lined Waveguide" by H. G. Unger, Bell System Technical Journal, Vol. 41, No. 2, March 1962, pp. 745–768;

"Helix Waveguide Theory and Application" by H. G. Unger, Bell System Technical Journal, Vol. 37, No. 6., September 1958, pp. 1599–1663;

"Normal Modes and Mode Conversion in Helix Waveguide" by H. G. Unger, Bell System Technical Journal, Vol. 40, No. 1, January 1961, pp. 255–280;

"Helix Waveguide" by S. P. Morgan and J. A. Young, Bell System Technical Journal, Vol. 35, No. 6, November 1956, pp. 1347–1384;

"Winding Tolerances in Helix Waveguide" by H. G. Unger, Bell System Technical Journal, Vol. 40, No. 2, March 1961, pp. 627–643; and "Normal Mode Bends for Circular Electric Waves" by H. G. Unger, Bell System Technical Journal, Vol. 36, No. 5, September 1957, pp. 1292–1307.

"Normal Modes in Overmoded Dielectric Lined Circular Waveguide" by J. W. Carlin and P. D'Agostino, Bell System Technical Journal, Vol. 52, No. 4, April 1973, pp. 453–486.

However, unfortunately, this prior work cannot be directly extrapolated to compact, optimized bends, structures with less overmoding, and limited dielectric material selection for high power application in radar and radio communications. Accordingly, the need exists for practical circular overmoded waveguide of optimum design.

SUMMARY OF THE INVENTION

The present invention relates generally to circular overmoded waveguide and, in particular, to circular overmoded waveguide of the dielectric lined and sheathed helix types which are optimally designed.

In accordance with the foregoing discussion, a principal object of the present invention is to provide an optimized design of low loss, high power overmoded waveguide specifically for S and X band operation and more generally for the microwave and lower millimeter wave bands.

Another object of the invention is to provide a circular overmoded TE$_{01}$ waveguide of optimal design for either the dielectric lined or sheathed helix waveguide configuration or a combination thereof.

These and other objects, purposes and characteristic features of the present invention will be pointed out or become apparent as the disclosure of the invention progresses, including the accompanying drawings, wherein.

DETAILED DESCRIPTION OF THE INVENTION

Figure 1A:
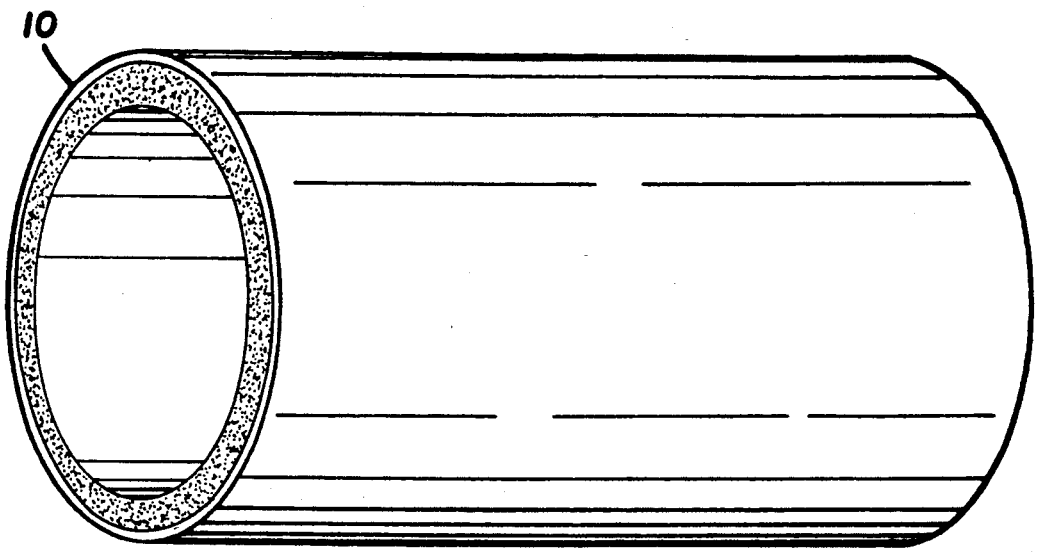
FIGS. 1a and 1b illustrate typical sections of dielectric lined and sheathed-helix waveguide.
Figure 1B:
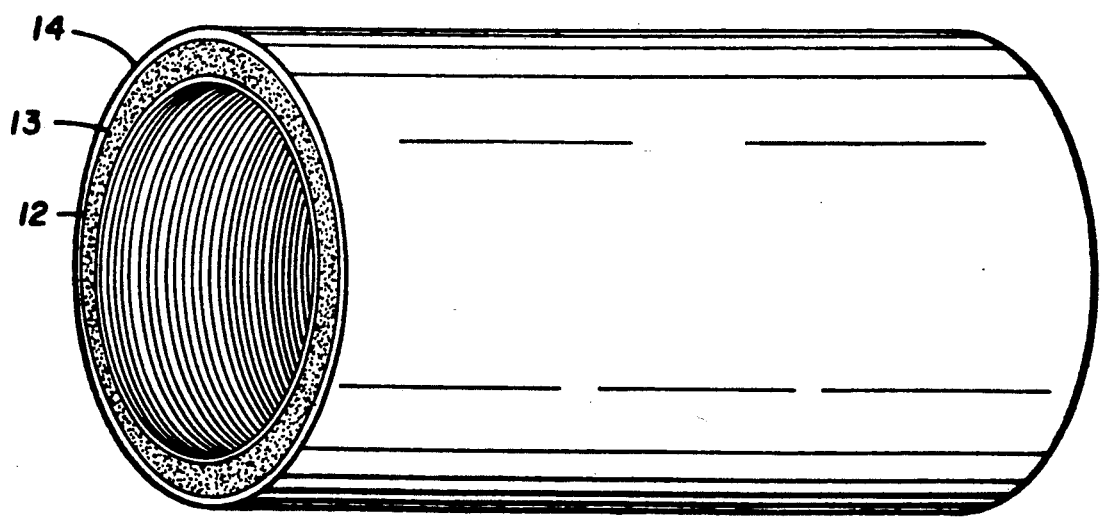

Referring first to FIGS. 1a and 1b, the most common configurations of overmoded circular waveguide are the dielectric lined structure shown in FIG. 1a and the sheathed helix structure shown in FIG. 1b. The dielectric lined waveguide is comprised of an outer conducting pipe 10 and an inner dielectric lining 11. The sheathed helix waveguide is formed of a closely wound insulated wire 12 surrounded by a two-layer jacket comprised of an inner layer of lossy dielectric 13 and an outer conductor layer or pipe 14. It is well-known that the sheathed helix configuration is particularly suited to strongly attenuating the unwanted modes while preserving the desirable transmission characteristics of the $TE_{01}$ mode. Moreover, it has been determined, via a parameter study using the CAD software proposed in accord with the present invention, that the sheathed helix waveguide provides lower losses and shorter-length bends than the dielectric lined waveguide. Further, because the conducting helix shields the dielectric sheath from high field intensities, the helix waveguide is considered capable of supporting higher power than lined waveguide because of reduced possibility of dielectric field breakdown.

The optimized waveguide proposed in accordance with the present invention is based, in part, upon an extensive parametric study of predicted performance versus design configuration for both sheathed-helix and lined overmoded waveguide. The performance measures considered included:

low $TE_{01}$ mode attenuation
suppression of unwanted modes
power capacity
minimum bend length
air cooling capability
high temperature rating
light weight
dielectric resistance to high field intensity and the relevant design parameters considered were as follows:

Waveguide radius (helix or lined guide wall)
  S-band (specifically 3 to 4 GHz for best results): 8 to 16 cm
  X-band (specifically 10 to 11 GHz for best results): 2.5 to 4.5 cm
Dielectric sheath/lining
  Thickness (fraction of waveguide radius): 0.025 to 0.1
  Real part of dielectric constant: 2 to 10.5
  Imaginary part of dielectric constant: $-10^{-4}$ to $-10^0$
Helix wire
  Pitch angles from 0.1 to 5°
  Ratio of wire diameter d to wire coating diameter D, d/D>0.8
  Wire diameter 1% of wavelength
  Low permitivity wire coating ($|\epsilon|<3.5$, loss tan $<10^{-2}$)
Bend
  Linear curvature profile (section of Cornu spiral)
  Bend length:
    S-Band: 2.5 m, 5 m, optimized <10 m
    X-Band: 0.8 m, 1.6 m, optimized <3 m
Conductors
  Helix waveguide outer conductor: aluminum or epoxy graphite
  Helix and lined waveguide wall: copper Based upon the results of this parametric study, the following design guidelines have resulted, for microwave through lower millimeter bands.

Figure 4:
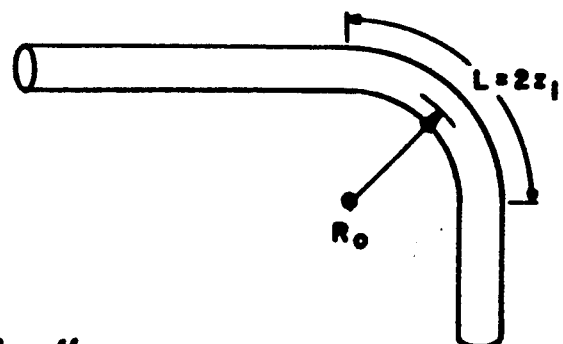
FIG. 4 is a simplified diagram of a sample waveguide bend configuration designed in accordance with the present invention; and, FIG. 5 is a simplified diagram of sample waveguide bend/curvature profiles.
Figure 5:
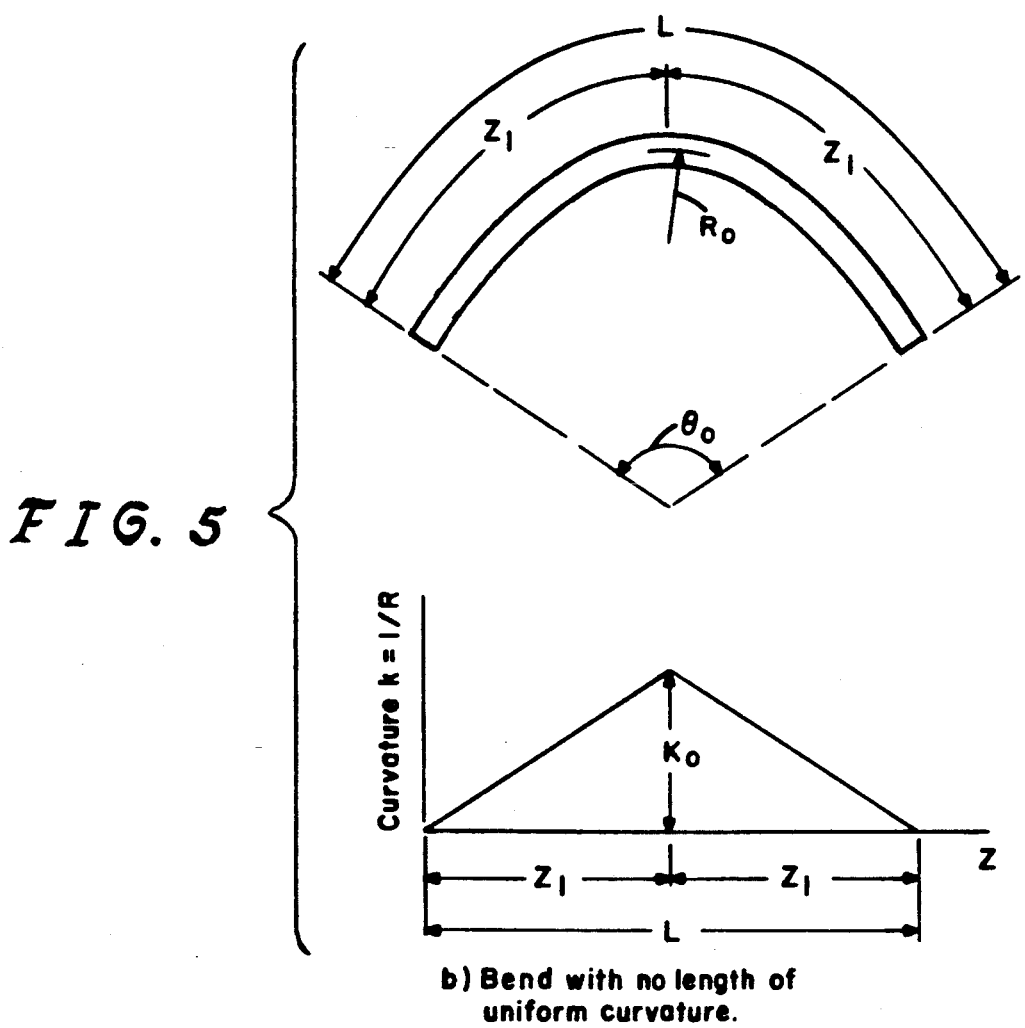

Dimensions for best constrained-size bend performance:
  Inner diameter ID (i.e., helix diameter or dielectric lining diameter):
  1¾ to 2 wavelengths
Ratio of bend length L to ID: 16 to 17
  (Linear variation in 1/R with R=Bend radius)
Best performance (i.e., lowest bend loss & lowest waveguide run loss with bends over <20% of run):
  Sheathed helix configuration:
    Sheath thickness (Delta): 7.5 to 10% of waveguide inside radius
    Real part of sheath dielectric constant: 6 to 11
    Imaginary part of sheath dielectric constant: $-0.005$ to $-0.05$ More particularly, the sample sheathed-helix waveguide shown in FIG. 2 comprises a helically wound copper wire surrounded by a lossy dielectric sheath and an outer aluminum conductor; whereas, the sample lined dielectric waveguide shown in FIG. 3 comprises an inner dielectric lining and an outer copper conducting pipe. The sample, 90° waveguide bend of FIG. 4 has a radius of curvature $R_0$ and a bend length L (between the straight sections) equal to $2Z_1$, where $Z_1$ is the length of linear curvature profile between a straight waveguide and the bend region of minimum radius $R_0$. As noted previously, in accordance with the present invention, the length of the bend is constrained to less than 10 meters for S-band operation and less than 3 meters for X-band operation. FIG. 5 illustrates a bend configuration whose curvature k varies linearly about the point of minimum radius; i.e. there is no length of uniform curvature and the bend profile thus comprises a section of a Cornu spiral.

Moderate performance:
  Sheathed helix configuration:
    Sheath thickness (Delta): 7.5 to 10% of waveguide inside radius
    Real part of sheath dielectric constant: 2 to 11
    Imaginary part of sheath dielectric constant: $-0.001$ to $-0.1$
  Dielectric lined waveguide configuration:
    Dielectric lining thickness (Delta): 7.5% of waveguide inside radius
    Real part of lining dielectric constant: 4 to 6
    Imaginary part of lining dielectric constant: $-0.0005$ to $-0.005$ (Must avoid lining resonance condition: i.e., $$\text{Lining thickness} = \frac{M\lambda}{4\sqrt{\text{Real Part Dielectric Constant} - 1}}$$

Where
m = 1,2,3, ...
λ = wavelength

Figure 2:
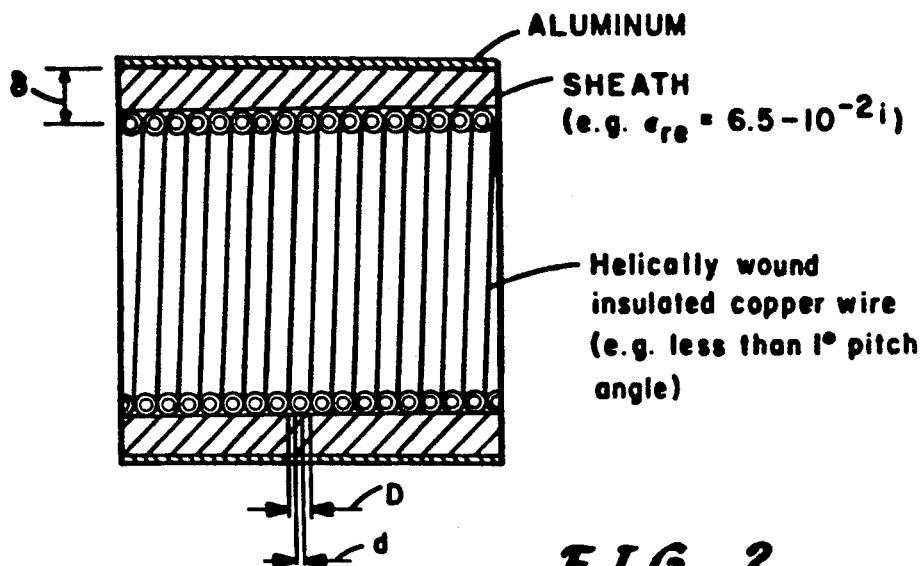
FIG. 2 is a simplified cross-sectional view of a segment of sample sheathed-helix waveguide designed in accordance with the preferred embodiment of the invention.
Figure 3:
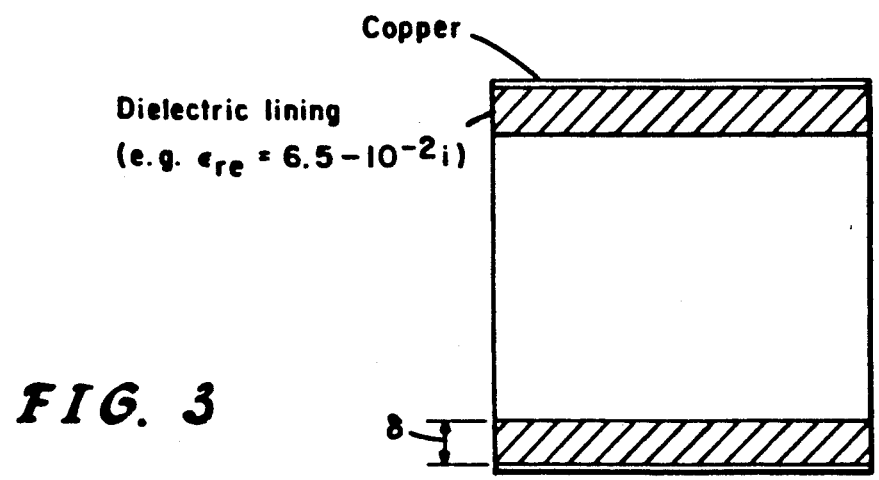
FIG. 3 is a simplified cross-sectional view of a segment of sample lined dielectric waveguide designed in accordance with the present invention.

Based upon the results from this parametric study, it is further apparent that helix waveguide provides lower loss and much more design flexibility than dielectric lined waveguide. This is primarily because the helix configuration suppresses unwanted modes better and because the $TE_{01}$ mode, supported by the helix, is not exposed to dielectric losses as in the lined waveguide case. The helix waveguide is also desirable because the dielectric sheath is not exposed to high field strengths in high power applications. The primary disadvantage of helix waveguide is that it is more difficult to construct. FIGS. 2, 3 and 4 of the accompanying drawings illustrate respectively samples of the sheathed-helix and dielectric lined waveguide designed in accordance with the present invention, as well as a sample waveguide bend.

Utilizing the computer-aided design (CAD) software provided in accordance with the teachings of our co-pending application, Ser. No. 07/310,193, which was issued as U.S. Pat. No. 5,046,016 the following design characteristics were selected for practical application:

| Parameter | S-band | X-band |
|---|---|---|
| Helix diameter | 16 cm | 6 cm |
| Sheath thickness | 0.8 cm | 0.3 cm |
| Sheath dielectric* constant | 5.2−0.5i (both bands) | |
| Helix | Polymide coated magnet wire | |
| wire size | #14 | #21 |
| d/D | .95 | .95 |
| pitch angle | 0.3° | 0.3° |
| Outer conductor | Aluminum (both bands) | |
| Bend (see FIG. 4) | | |
| minimum bend radius $R_o$ | 2.46 ft | 0.82 ft |
| maximum curvature $k_o$ | .4065 ft$^{-1}$ | .219 ft$^{-1}$ |
| length L = $2Z_1$ | 7.728 ft | 2.6 ft |
| $\Theta_o$ | 90° | 90° |
| curvature slope m | .1052 | .9377 |

(*e.g. Emerson & Cuming ECCO S2L9524 w/high dielectric strength and heat resistance)

For such waveguide, at S band, the calculated predicted performance for the bend configuration shown in FIG. 4 indicates a total bend loss of approximately 0.013 dB; whereas, for a 150 foot waveguide system including a straight section and a 90° bend, the total loss was calculated to be about 0.15 dB. This compares to standard rectangular waveguide loss of over 1 dB. This total loss corresponds to an average of tens of watts per foot dissipation at hundreds of kilowatts average power, if all attenuation is converted to heat, and heat loss increases by less than 60% in the bend. From preliminary analysis, air cooling of the waveguide system should be sufficient even at these extreme power levels.

From the foregoing discussion it should be readily apparent that the waveguide design attained in accordance with the present invention exhibits the desired low attenuation, both in a compact bend and over the total guide length. It has been determined that similar calculated performance is achieved for a variety of helix design parameter combinations. Note also that for the above guide radii and if the frequency range of interest is less than 30% of center operating frequency, propagation of $TE_{01}$ modes (n=1) and the $TE_{21}$ mode are in cutoff. As the waveguide helix structure does not suppress circular TE modes above their cutoff frequencies, this is a desirable attribute. Similarly, although indirect mode coupling to the $TE_{21}$ mode is not expected for these configurations, this mode does not even exist is this case.

It will be readily understood by those of ordinary skill in the waveguide field that various modifications, alterations and embodiments are suggested and/or contemplated within the scope of the foregoing disclosure, and therefore it should be understood that within the scope of the appended claims, the invention may be practiced otherwise than as specifically described hereinabove.

What we claim is:

1. A circular overmoded waveguide structure of the sheathed-helix type designed for operation with an electromagnetic signal at a predetermined operating frequency and including at least one straight section connected to at least one bend section, said sheathed-helix waveguide operating in an overmoded condition and supporting the $TE_{01}$ mode associated with said electromagnetic signal, and comprising a wound helix of conductive wire of selected wire diameter coated with insulation of selected diameter disposed within a dielectric sheath and an outer conductor layer disposed outside of and surrounding said dielectric sheath, said helix wire having a conductivity being substantially greater than a conductivity associated with said outer conductor layer, said wound helix having a diameter defining an inside diameter of said waveguide measured at a cross-section of said waveguide, said inside diameter being within the range 1.75 to 2.0 wavelengths at said electromagnetic signal operating frequency, said dielectric sheath having a thickness within the range 7.5% to 10% of an inside radius of said waveguide and comprising a dielectric material with a complex dielectric constant having both real and imaginary parts, said real part being within the range 2 to 11 and said imaginary part being within the range −0.001 to −0.1, and said at least one bend section having a bend length of approximately 16 to 17 times the inside diameter of said helix.

2. The overmoded waveguide structure specified in claim 1 wherein said real part of said sheath dielectric constant is within the range 6 to 11, and the imaginary part of said sheath dielectric constant is within the range −0.005 to −0.05.

3. The overmoded waveguide structure specified in claim 1 wherein said operating frequency is within the S-band and said bend section has a linear curvature profile and said bend length being less than 10 meters for a 90° bend.

4. The overmoded waveguide structure specified in claim 1 wherein said operating frequency is within the X-band and said bend section has a linear curvature profile and said bend length being less than 3 meters for a 90° bend.

5. The overmoded waveguide structure specified in claims 1, 2, 3 or 4 wherein said wound helix of insulated wire has the following design parameters:
pitch angle within the range 0.1° to 5°, ratio of wire diameter to wire insulation coating diameter greater than 0.8, wire diameter approximately 1% of operating wavelength at said electromagnetic signal operating frequency, and wire insulation coating of low permittivity.

6. A circular overmoded waveguide structure of the lined dielectric type designed for operation with an electromagnetic signal at a preselected operating frequency and including at least one straight section connected to at least one bend section, said lined dielectric waveguide operating in an overmoded condition and supporting the $TE_{01}$ mode associated with said electromagnetic signal, and comprising a dielectric lining and an outer conductor wall disposed outside of and surrounding said dielectric lining, said waveguide having an inside diameter within the range 1.75 to 2.0 wavelengths at said electromagnetic signal operating frequency, said dielectric lining having a thickness approximately 7.5% of an inside radius of said waveguide and comprising a dielectric material with a complex dielectric constant having both real and imaginary parts, said real part being within the range 4 to 6 and said imaginary part being within the range $-0.0005$ to $-0.005$, said at least one bend section having a bend length of approximately 16 to 17 times the inside diameter of said waveguide.

7. The overmoded waveguide structure as specified in claim 6 wherein said operating frequency is within the S-band and said at least one bend section has a linear curvature profile and said bend length being less than 10 meters for a 90° bend.

8. The overmoded waveguide structure as specified in claim 6 wherein said operating frequency is within the X-band and said at least one bend section has a linear curvature profile and said bend length being less than 3 meters for a 90° bend.

* * * * *